United States Patent [19]

Hundt et al.

[11] Patent Number: 5,451,715

[45] Date of Patent: Sep. 19, 1995

[54] MOLDED PACKAGE INTEGRATED CIRCUIT WITH ELECTROCHEMICAL CELL

[75] Inventors: Michael J. Hundt, Double Oak; Krishnan Kelappan, Carrollton; Harry M. Siegel, Hurst, all of Tex.

[73] Assignee: SGS-Thomson Microelectronics, Inc., Carrollton, Tex.

[21] Appl. No.: 105,301

[22] Filed: Aug. 11, 1993

[51] Int. Cl.[6] .......................................... H01L 23/02
[52] U.S. Cl. ........................................ 174/52.4; 257/678
[58] Field of Search ............... 174/52.4; 257/678, 683, 257/684, 685, 686, 688, 689, 690

[56] References Cited

U.S. PATENT DOCUMENTS

| | | | |
|---|---|---|---|
| 5,055,704 | 10/1991 | Link et al. | 307/66 |
| 5,124,782 | 6/1992 | Hundt et al. | 257/678 |
| 5,153,710 | 10/1992 | McCain | 365/228 |
| 5,187,564 | 2/1993 | McCain | 257/678 |

Primary Examiner—Lincoln Donovan
Attorney, Agent, or Firm—Rodney M. Anderson; Lisa K. Jorgenson; Richard K. Robinson

[57] ABSTRACT

A packaged integrated circuit and method of manufacturing the same is disclosed. The semiconductor integrated circuit chip is mounted and bonded to a lead frame in the conventional fashion, and an inner molded body is formed therearound. The leads of the lead frame have inner and outer dambars, with the inner dambars located so as to prevent bleedout of mold compound during the molding of the inner body. Upon removal of the inner dambars, two tie bars become floating and are then formed to extend above the inner molded body so as to make contact to an electrochemical cell that is attached to the inner molded body. An outer body is then molded to surround the inner molded body and the cell, with the outer dambars located so as to prevent bleedout of mold compound. Removal of the outer dambars and formation of the leads into the desired shape completes the assembly of the packaged integrated circuit. A molded integrated circuit package including both the integrated circuit together with a battery for backup or primary power is thus provided.

18 Claims, 4 Drawing Sheets

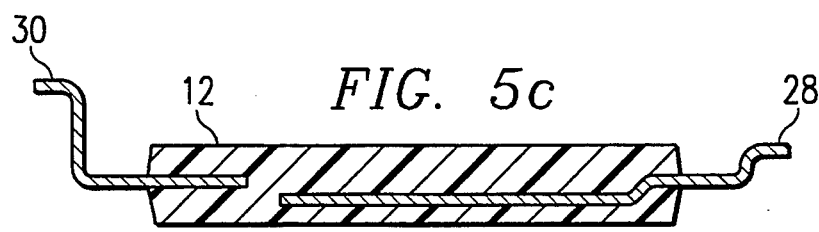
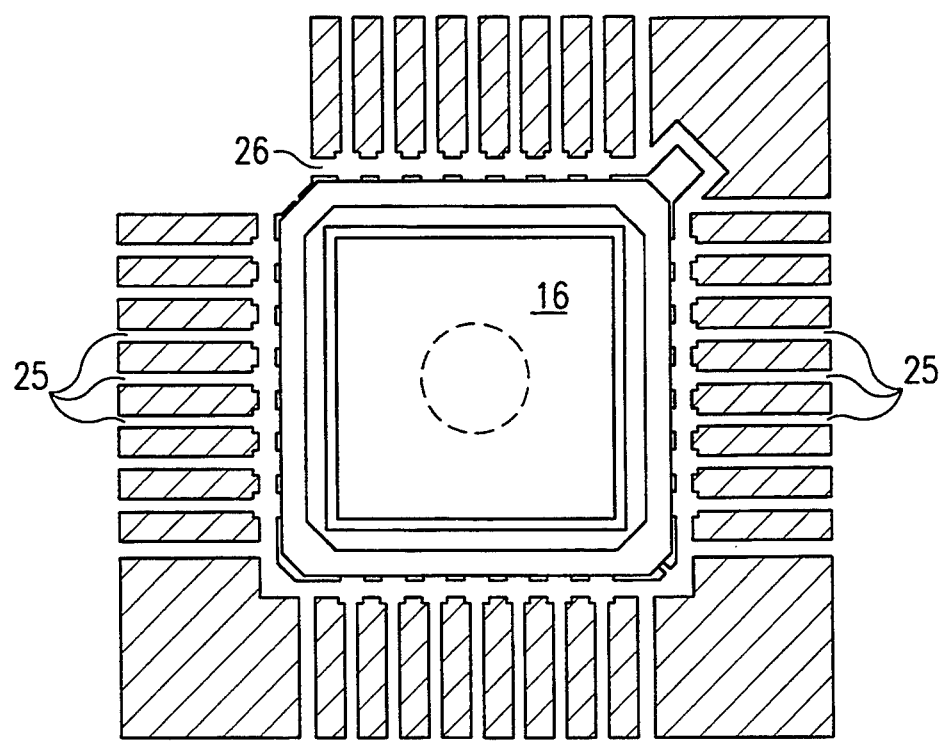

MOLDED PACKAGE INTEGRATED CIRCUIT WITH ELECTROCHEMICAL CELL

This invention is in the field of integrated circuits, and is more specifically directed to molded packages for the same.

BACKGROUND OF THE INVENTION

In the field of integrated circuits, the use of plastic molded packages for providing mechanical and environmental protection for the integrated circuit chips has become commonplace. Such plastic molded packages are primarily beneficial due to their low cost of manufacture relative to ceramic encapsulated packages, particularly in avoiding the high cost of the piece parts of ceramic encapsulated packages.

Complementary metal-oxide-semiconductor (CMOS) technology for the design and fabrication of integrated circuits has also become more popular in recent years, due to the very low level of standby power dissipation in circuits fabricated according to this technology. Low power CMOS integrated circuits have enabled the widespread use of battery power in modern electronic systems, whether as backup or as primary power, as the operating life of the batteries in powering these low power circuits can be quite long.

Implementation of battery-powered integrated circuits into electronic systems, even as backup power, requires an additional degree of complexity in the system design and manufacture. As such, it has been desirable for some time to integrally package an electrical cell, or battery, within the integrated circuit package. Copending application Ser. No. 07/995,665, filed Dec. 21, 1992, entitled "Surface Mountable Integrated Circuit Package with Integrated Battery Mount" assigned to SGS-Thomson Microelectronics, Inc. and incorporated herein by this reference, describes an integrated circuit package of the surface-mountable type within which a battery is mounted to leads that extend from the side of an internal package body, with a housing attached to the package over the battery. Gaps between the housing and the internal package body provide thermal insulation of the battery from the package body, so that the circuit may be subjected to solder reflow mounting to a circuit board in the conventional sense for surface mountable packages, while insulating the battery from the high soldering temperatures.

By way of further background, it is desirable and customary in the art to test each integrated circuit in a fully functional manner, so that the integrated circuit customer can receive lots of the packaged circuit that are substantially free of defects. In many cases, however, integrated circuits having a battery backup mode cannot have their backup functionality tested with the actual battery with which they will be installed, but instead can only be tested in a circumstantial manner with an external battery source. Furthermore, while prior hybrid package techniques that include a battery with the integrated circuit are known, such prior techniques require high cost ceramic piece parts (such as headers, lids and the like), and thus are not suitable for use with high quantity commodity circuits such as random access memories, which are to be sold in highly price-competitive markets.

It is therefore an object of the present invention to provide a molded integrated circuit package within which both an integrated circuit and a battery power source are molded.

It is a further object of the present invention to provide such a package which enables complete functional testing of the integrated circuit, including the functionality of its battery backup capability.

It is a further object of the present invention to provide such a package which includes an inner package for the integrated circuit chip itself, so that assembly of the circuit and battery package may be done with a reduced risk that the integrated circuit chip will be damaged.

Other objects and advantages of the present invention will be apparent to those of ordinary skill in the art having reference to the following specification together with the drawings.

SUMMARY OF THE INVENTION

The invention may be implemented into a plastic molded integrated circuit package based around a lead frame with two sets of dambars. After attachment of the integrated circuit chip to the die attach portion of the lead frame, an inner molded package is formed around the chip, after which the inner dam bars are broken. Two of the leads may extend away from the inner molded package for eventual connection to an electrical cell. After installation of the electrical cell in contact with the two extending leads, a second outer plastic package is molded around the inner package and the electrical cell; the outer dambars are then removed, and the external leads trimmed and formed in the conventional manner.

BRIEF DESCRIPTION OF THE DRAWINGS

FIGS. 5a, 5b and 5d are plan views of the package of FIG. 1, including the lead frame of FIG. 3, during particular steps in the process of forming the package according to the preferred embodiment of the invention.

FIG. 5c is a cross-sectional view of the package of FIG. 4b.

DETAILED DESCRIPTION OF THE PREFERRED EMBODIMENT

Figure 1:
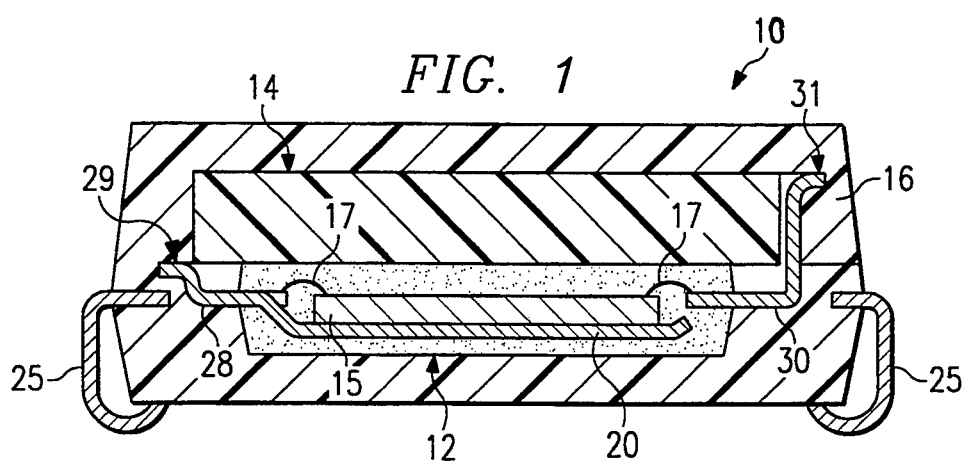
FIG. 1 is a cross-sectional view of an integrated circuit package according to the preferred embodiment of the invention.
Figure 2:
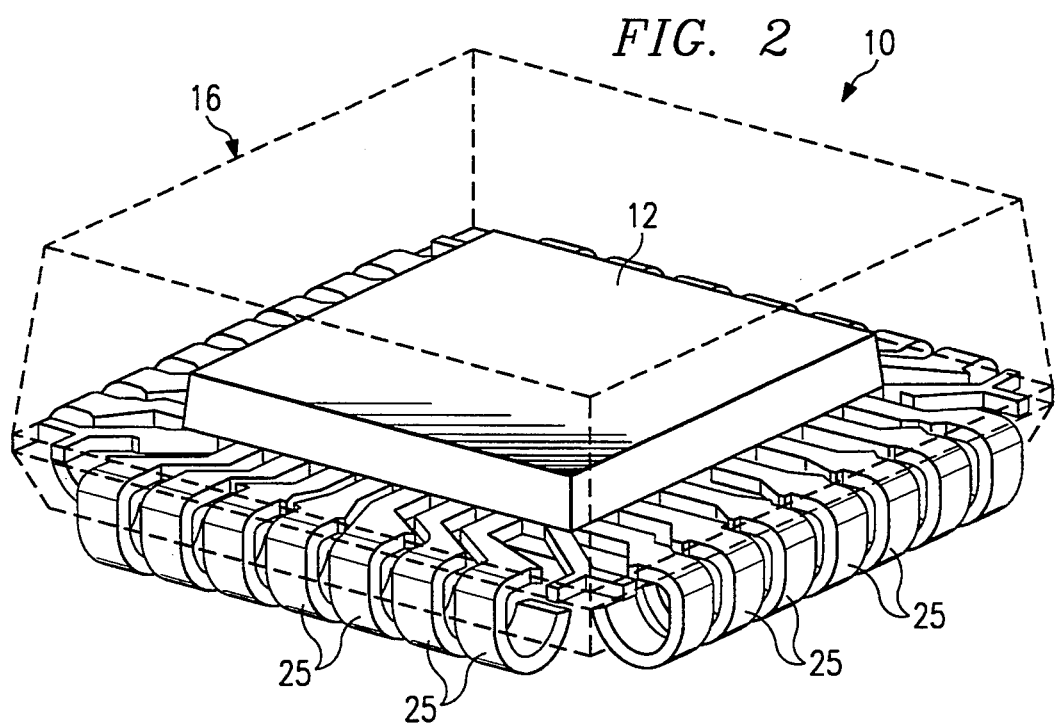
FIG. 2 is a perspective view of the integrated circuit package of FIG. 1, illustrating certain of the interior elements thereof.

Referring first to FIGS. 1 and 2, the construction of a completed integrated circuit package 10 according to the preferred embodiment of the invention will be described in detail. Integrated circuit package 10 includes integrated circuit chip 15 which may be a semiconductor integrated circuit of conventional design and fabrication, and thus may be of either the analog or digital type. As will become apparent from the description hereinbelow, considering that integrated circuit chip 15 will be powered by a battery (either as primary power or as a backup power source), the present invention is particularly well suited for digital integrated circuits formed according to the well-known complementary metal-oxide-semiconductor (CMOS) technology.

Integrated circuit chip 15 is attached in the conventional fashion to a metal lead frame. As illustrated in FIG. 1, chip 15 is directly attached to die attach 20, for example by way of conductive epoxy, and attached by way of wire bonds 17 to battery leads 28, 30, and also to J-shaped external leads 25 (to which bonds 17 are not shown in FIG. 1). Leads 28, 30 are, of course, wire bonded to power supply and ground bond pads of chip 15, so that cell 24 will be able to provide power to the appropriate nodes of chip 15. Of course, other types of chip-to-lead connection, such as beam lead, solder bumps, and the like may alternatively be used.

According to this embodiment of the invention, chip 15, die attach 20, wire bonds 17 and a portion of leads 25, 28, 30 are encapsulated within inner molded body 12. Inner molded body 12 consists of conventional mold compound, such as Sumitomo 6300, which has been transfer molded around chip 15 and cured in the conventional manner. Battery leads 28, 30 extend outwardly from inner molded body 12.

Figure 3A:
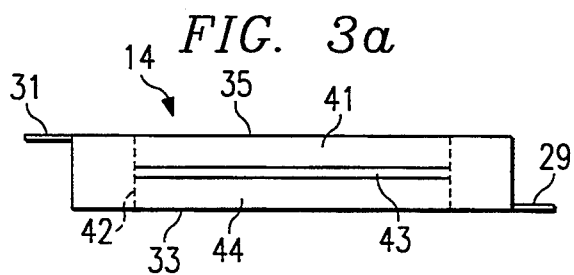
FIGS. 3a and 3b are cross-sectional and plan views, respectively, of an electrical cell useful in connection with the preferred embodiment of the invention.
Figure 3B:
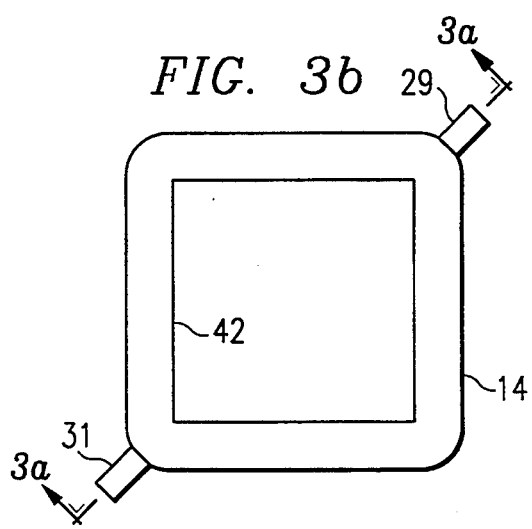

Electrochemical cell 14 is attached by way of epoxy or other adhesive to one surface of inner molded body 12. Conductive tabs 29, 31 of cell 14 are electrically connected to battery leads 28, 30, respectively, by welding, solder, conductive epoxy, or in another conventional fashion. According to the preferred embodiment of the invention, cell 14 is preferably of the well-known lithium type, having the configuration illustrated in FIGS. 3a and 3b. As illustrated in FIG. 3a, cell 14 includes ceramic window frame 42 within which is disposed cathode matrix 41 and lithium electrolyte 44, separated by separator 43 in the conventional manner. The exterior shape of cell 14 is substantially square, as shown in FIG. 3b. Electrodes 33, 35, preferably formed of copper foil, are disposed at the lower and upper surfaces of cell 14, with tabs 29, 31, respectively, extending therefrom on opposite corners.

Referring back to FIG. 1, cell 14 and inner molded body 12 are encapsulated together by outer molded body 16, which also consists of conventional molding compound, such as Sumitomo 6300, that is transfer molded and cured in the conventional manner to surround cell 14 and inner molded body 12. As illustrated in FIG. 2 (outer molded body 16 shown in phantom, with cell 14 not shown), leads 25 extend from outside of inner molded body 12 and are formed into the conventional J-lead shape for subsequent connection to a circuit board.

As a result of the package of FIGS. 1 and 2, cell 14 is integrally molded within the packaged integrated circuit 10 and in electrical connection with integrated circuit chip 15, such that battery backup (or primary) power is provided within packaged integrated circuit 10. Inner molded body 12 provides mechanical protection for chip 15 and wire bonds 17 during the connection of cell 14 and the molding of outer molded body 16, greatly reducing the risk of damage to the active circuit.

Figure 4:
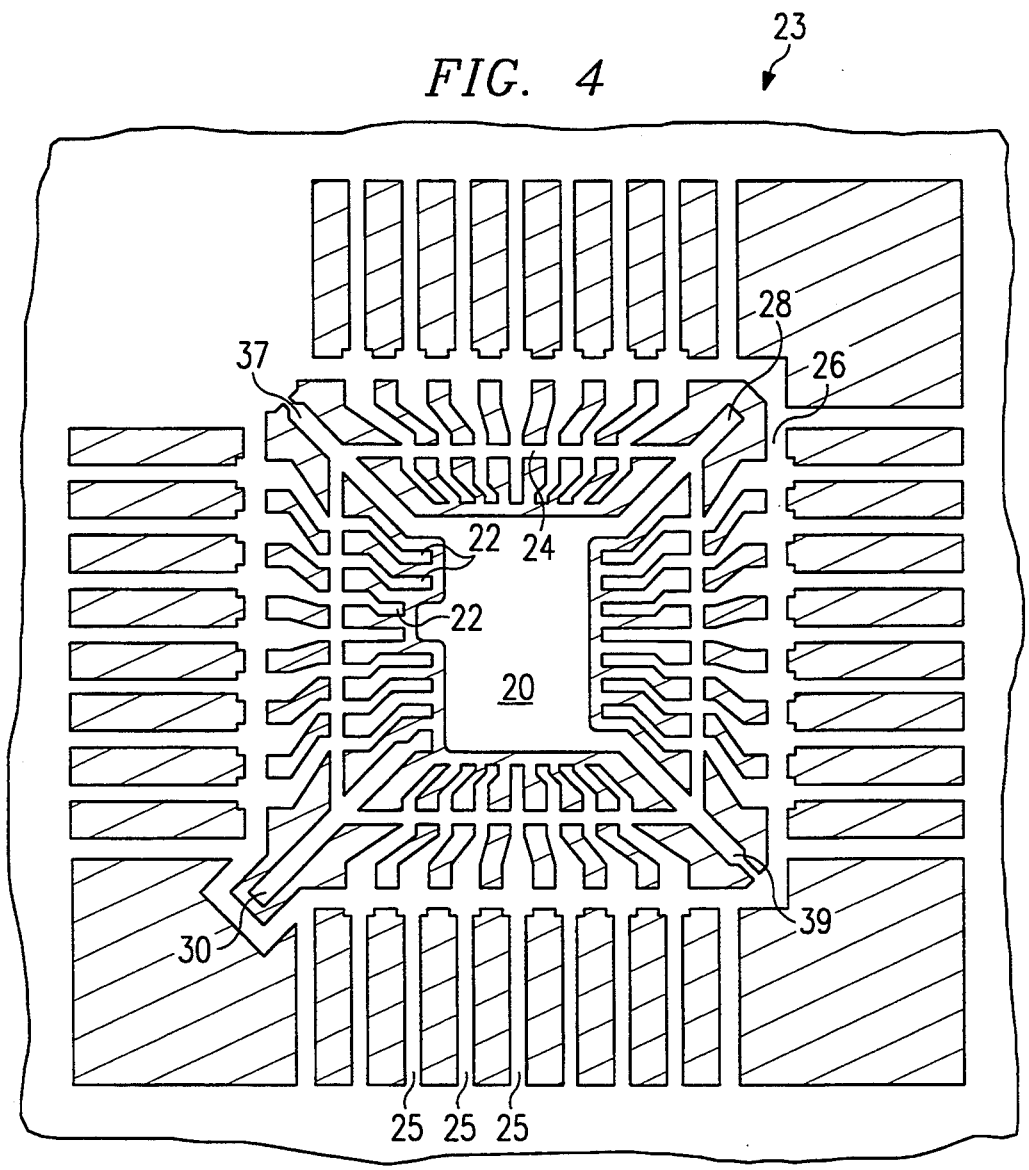
FIG. 4 is a plan view of the lead frame of the package of FIG. 1.

Referring now to FIG. 4, lead frame 23 according to the preferred embodiment of the invention is illustrated in plan view. As is well known in the art, lead frames are generally formed by etching or stamping of the lead frame material (e.g., ALLOY-42 metal alloy, silver-plated copper alloy, etc.) in such a manner that multiple lead frames 23 are arranged in a contiguous array (i.e., "strip"), with similarly formed lead frames will be adjacent to lead frame 23. Lead frames 23 will remain in strip form until after the formation of outer molded body 16.

Lead frame 23 according to this embodiment of the invention includes inner dambar 24 and outer dambar 26. Dambars 24, 26 surround die attach 20 within lead frame 23, and are integrally formed with inner leads 22 and external J-leads 25 (J-leads 25 having not yet been formed into the J shape in FIG. 4). Inner dambar 24 is located closely outside of the expected perimeter of inner molded body 12 to prevent bleedout of mold compound during its transfer molding. Similarly, outer dambar 26 is located closely outside of the expected perimeter of outer molded body 16 to prevent bleedout of mold compound during the transfer molding of outer molded body 16. In addition, lead frame 23 includes two floating tie bars 28, 30 located at diametrically opposite corners of die attach 20. After the molding of inner molded body 12, tie bars 28, 30 will be formed into electrodes 28, 30 for connection to cell 14 as shown in FIG. 1. Tie bars 37, 39 are located at the other corners of die attach 20; gating for the molding of both inner and outer molded bodies 12, 16 will be across tie bars 37, 39.

The construction of integrated circuit package 10 will now be described in detail relative to certain manufacturing steps in the process, and as shown in FIGS. 5a through 5e.

Figure 5A:
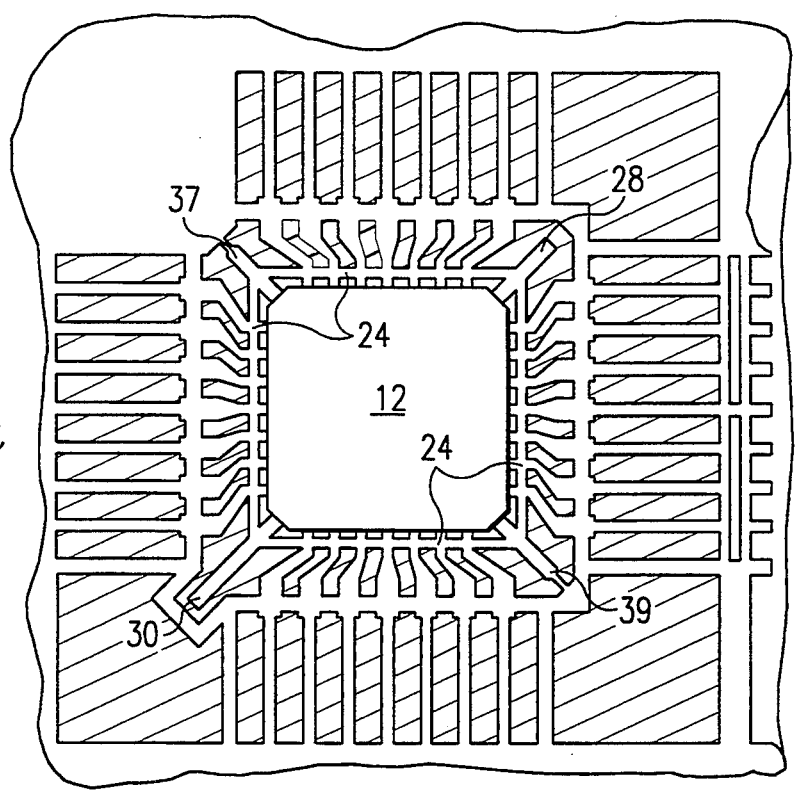

Referring first to FIG. 5a, package 10 is illustrated after the molding of inner molded body 12. As evident from the above description, prior to the molding of inner molded body 12, chip 15 is attached to die attach 20 and wire bonds 17 are formed to connect chip 15 to inner leads 22. Both inner dambars 24 and outer dambars 26 are intact at the point of the manufacturing process illustrated in FIG. 5a. At this point, inner dambars 24 have prevented bleedout of mold compound or resin from the mold cavity used in the formation of inner molded body 12.

Figure 5B:
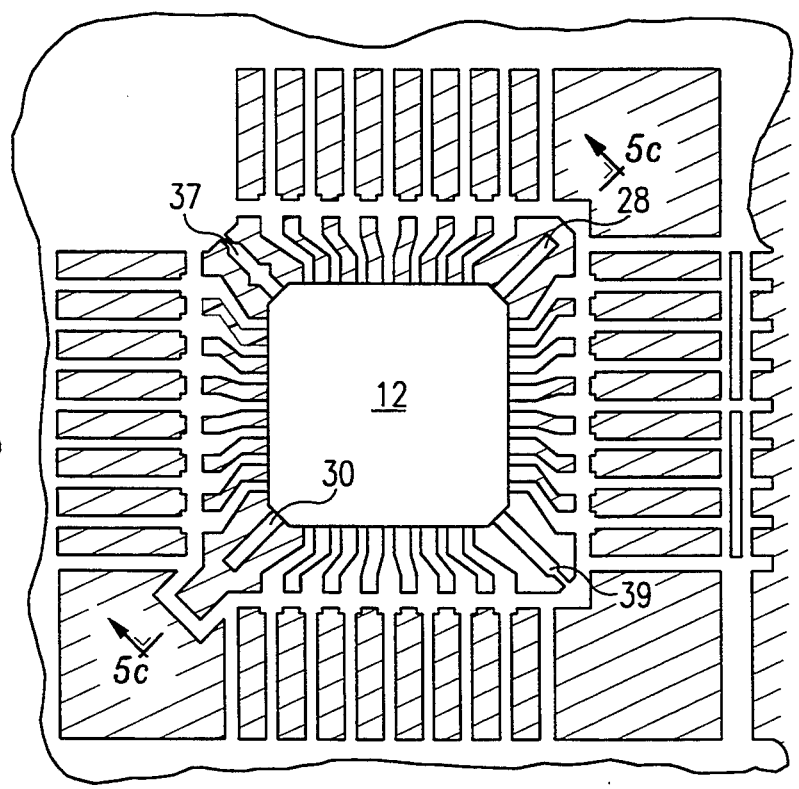

Referring now to FIGS. 5b and 5c, package 10 is illustrated after a trim operation which removes inner dambars 24, which will allow each lead 25 to be electrically isolated from its neighbors upon the subsequent removal of outer dambars 26. Outer dambars 26 remain intact after this step, however, to provide damming of the mold compound in the later formation of outer molded body 16. The removal of inner dambars 24 thus allows floating tie bars 28, 30 to be electrically disconnected from the remainder of leads 25, while held in position by inner molded body 12. Following the removal of inner dambars 24, a trim and form operation bends tie bars 28, 30 into the proper position for electrical connection to electrochemical cell 14, as illustrated in FIG. 5c.

Electrochemical cell 14 is next electrically connected to electrodes 28, 30 and physically attached to inner molded body 12. It is preferred that the body of cell 14 be attached to inner molded body 12 by way of a conventional adhesive such as an epoxy. The electrical connection between tabs 29, 31 and electrodes 28, 30 is preferably made by way of opposed electrode resistance welding.

Following the attachment and connection of cell 14 to inner molded body 12, outer molded body 16 is formed by way of transfer molding of mold compound thereover, such molding gated across tie bars 37, 39 as before. FIG. 5d illustrates package 10 in this state of manufacture, with outer molded body 16 molded in place. Outer dambars 26 thus have served to prevent bleedout of mold compound from the cavity. Following the formation of outer molded body 16, final trim and form of leads 25 is performed, by way of which outer dambars 26 are removed, and leads 25 are formed into the J-shaped leads illustrated in FIG. 2. Tie bars 37, 39 are also removed by this operation, and each package 10 separated from the strip of multiple lead frames 23 to become an individual packaged integrated circuit.

As a result of the present invention, a molded integrated circuit package is provided within which an electrical cell is integrally formed with the circuit, thus facilitating the implementation of battery backup power (or primary battery power) into the final application of the circuit. In addition, full functional testing of the integrated circuit may be performed with the actual electrochemical cell that will be powering the chip in its final installation. The manufacturing process for this package utilizes conventional molding technology, and avoids the high cost of ceramic piece parts. Furthermore, the integrated circuit chip is protected by the inner molded body during the connection of the cell into the package, and during the final molding of the outer body.

The preferred embodiment of the invention is described hereinabove relative to a J-lead chip carrier package. It is of course to be understood that the present invention may also be applied to other leaded package types, such as dual in-line packages (DIPs), single in-line packages (SIPs), flatpack chip carriers, and the like.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A packaged integrated circuit, comprising:
   a semiconductor integrated circuit;
   a die attach, attached to said circuit;
   a plurality of leads;
   means for electricaly connecting said plurality of leads to said circuit;
   a first molded body surrounding said circuit and said connecting means, in such a manner that said plurality of leads extend from said first molded body;
   an electrochemical cell, electrically connected to said circuit through said first molded body; and
   a second molded body surrounding said first molded body and said cell, said plurality of leads extending therefrom.

2. The packaged integrated circuit of claim 1, further comprising:
   first and second battery leads, in electrical connection with said circuit, extending from said first molded body and connected to said cell.

3. The packaged integrated circuit of claim 1, wherein said cell is adhesively attached to said first molded body.

4. The packaged integrated circuit of claim 1, wherein said cell is of the lithium type.

5. The packaged integrated circuit of claim 1, wherein said circuit is of the CMOS type.

6. The packaged integrated circuit of claim 1, wherein said leads are of the J-shaped type.

7. The packaged integrated circuit of claim 1, wherein said connecting means comprise wire bonds.

8. A lead frame, suitable for use in molded packaging of an integrated circuit, comprising:
   a die attach;
   a plurality of leads extending away from said die attach, each of said plurality of leads connected to adjacent leads by way of first and second dambars, said first dambars being nearer said die attach than said second dambars, and each of said plurality of leads having a portion, disposed nearer the die attach than the first dambars, that is adapted to be connected to the integrated circuit; and
   first and second floating tie bars, each extending away from said die attach, each of said first and second floating tie bars connected to adjacent ones of said plurality of leads only by way of said first dambars so that, when said first dambars are removed from said lead frame, each of said first and second floating tie bars is electrically isolated from its adjacent leads.

9. The lead frame of claim 8, wherein said die attach is rectangular, and wherein said plurality of leads extend away from all four sides of said die attach.

10. The lead frame of claim 9, wherein said first and second floating tie bars are disposed near corners of said die attach.

11. The lead frame of claim 8, further comprising:
    first and second tie bars, connected to adjacent leads by said first and second dambars and disposed on opposing sides of said die attach from one another.

12. The lead frame of claim 8, wherein said lead frame is connected to other lead frames in a strip fashion.

13. A method of packaging an integrated circuit, comprising:
    attaching an integrated circuit to the die attach portion of a lead frame;
    forming electrical connections between said integrated circuit and a plurality of leads of said lead frame;
    then molding an inner molded body around said integrated circuit and the electrical connections between the integrated circuit and said leads, so that said leads extend from said inner molded body;
    electrically connecting an electrochemical cell to first and second ones of said plurality of leads; and
    molding an outer molded body around said inner molded body and said cell.

14. The method of claim 13, further comprising:
    after said step of molding an inner molded body, removing inner dambars from between said plurality of leads, said inner dambars being located near the outer perimeter of said inner molded body.

15. The method of claim 14, further comprising:
    after said step of molding an inner molded body, forming said first and second ones of said plurality of leads to extend above a first surface of said inner molded body.

16. The method of claim 15, further comprising:
    attaching said cell to said first surface of said inner molded body.

17. The method of claim 14, further comprising:
    after said step of forming said outer molded body, removing outer dambars from between those of said plurality of leads that extend beyond said outer molded body, said outer dambars being located near the outer perimeter of said inner molded body.

18. The method of claim 17, further comprising:
    forming those of said plurality of leads that extend beyond said outer molded body into a J shape.

* * * * *